(12) United States Patent
Iwai et al.

(10) Patent No.: US 7,449,064 B2
(45) Date of Patent: Nov. 11, 2008

(54) METHOD FOR PRODUCING ALN SINGLE CRYSTAL AND ALN SINGLE CRYSTAL

(75) Inventors: Makoto Iwai, Kasugai (JP); Katsuhiro Imai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/682,385

(22) Filed: Mar. 6, 2007

(65) Prior Publication Data

US 2007/0144427 A1 Jun. 28, 2007

Related U.S. Application Data

(63) Continuation of application No. PCT/JP2005/016672, filed on Sep. 5, 2005.

(30) Foreign Application Priority Data

Sep. 16, 2004 (JP) ............................. 2004-269319

(51) Int. Cl.
*C30B 11/02* (2006.01)
(52) U.S. Cl. ............................. 117/81; 117/83; 117/85
(58) Field of Classification Search .................... 117/81, 117/83, 85

See application file for complete search history.

(56) References Cited

FOREIGN PATENT DOCUMENTS

| JP | 2000-327495 A1 | 11/2000 |
| JP | 2003-119099 A1 | 4/2003 |
| JP | 2003-335600 A1 | 11/2003 |

OTHER PUBLICATIONS

K. Yasui et al., "Growth of $Al_xGa_{1-x}N$ and $In_yGa_{1-y}N$ Single Crystals Using the Na Flux Method," *Phys. Stat. Sol.*, 2001, vol. 188, No. 1, pp. 415 to 419.

M. Yano et al., "*Growth of Nitride Crystals, BN, AlN and GaN by Using a Na Flux*," Diamond ad Related Materials, 2000, vol. 9, pp. 512-515.

Hisanori Yamane et al., "*Natrium o Mochiita AlN no Teion Gosei*," The Ceramic Society of Japan Shunki Symposium Koen Yokoshu, 1998, vol. 11, p. 157.

Cortland O. Dugger, "*The Synthesis of Aluminum Nitride Single Crystals*," Mat. Res. Bull. vol. 9, pp. 331-336, 1974.

*Primary Examiner*—Felisa C Hiteshew
(74) *Attorney, Agent, or Firm*—Burr & Brown

(57) ABSTRACT

An AlN single crystal is grown by pressurizing a melt including at least gallium, aluminum and sodium in an atmosphere containing nitrogen. Preferably, the AlN single crystal is grown under a nitrogen partial pressure of 50 atms or lower and at a temperature in a range of 850° C. to 1200° C.

5 Claims, No Drawings

METHOD FOR PRODUCING AlN SINGLE CRYSTAL AND AlN SINGLE CRYSTAL

FIELD OF THE INVENTION

The present invention relates to a method of producing AlN single crystals by means of a flux method and AlN single crystals.

BACKGROUND OF THE INVENTION

Aluminum nitride has a band gap of 6.2 eV and a high thermal conductivity, so that it is excellent as a substrate material for a light emitter (LED, LD) in the ultra-violet region and for an electronic device. The development of a production technique of producing a semiconductor wafer has been desired. Until now, production techniques of AlN single crystal such as sublimation and HVPE methods have been proposed. A technique of producing AlN according to flux method (solution method) was disclosed in Japanese patent publication 2003-119099A and "Mat. Res. Bull." Vol. 9 (1974), pages 331 to 336. A transition metal is used as a flux in Japanese patent publication 2003-119099A. An AlN single crystal is obtained from $Ca_3N_2$ and AlN powder in "Mat. Res. Bull." Vol. 9 (1974), pages 331 to 336.

It has recently been reported that bulk gallium nitride single crystal of a high quality can be synthesized at a relatively low temperature and a low pressure by using Na as a catalyst (Japanese patent publication 2000-327495A). The raw materials are gallium and sodium azide.

Further, according to "Phys. Stat. Sol." Vol. 188 (2001) pages 415 to 419, a crystal of an AlGaN solid solution (size: 300 to 500 microns, composition; $Al_{0.22}Ga_{0.78}N$) were successfully grown at a pressure of about 100 to 110 atms (10 to 11 MPa) from 750° C. to 800° C. using raw materials of sodium azide, gallium and aluminum.

According to prior art Japanese patent publication 2003-119099A, "Mat. Res. Bull." Vol. 9 (1974), pages 331 to 336 and the like, an AlN single crystal having a large size and high quality (low defect density) has not been successfully grown. According to "Phys. Stat. Sol." Vol. 188 (2001) pages 415 to 419, although single crystals have been successfully grown from an AlGaN solid solution containing a small amount of Al. An AlN single crystal is not described or suggested.

SUMMARY OF THE INVENTION

An object of the present invention is to provide a novel method of growing an AlN single crystal. Another object of the present invention is to provide an AlN single crystal of a high quality. The present invention provides a method of producing an AlN single crystal, the method comprising the step of pressurizing a melt comprising at least gallium, aluminum and a flux comprising sodium in an atmosphere comprising nitrogen to grow an AlN single crystal. The present invention further provides an AlN single crystal grown by the method.

The present inventors have successfully grown an AlN single crystal without precipitating a GaN crystal, by pressurizing a melt comprising at least gallium, aluminum and a flux comprising sodium in an atmosphere comprising nitrogen, and have reached the present invention.

DETAILED DESCRIPTION OF THE INVENTION

According to the present invention, a melt comprising at least gallium, aluminum and sodium is pressurized in an atmosphere comprising nitrogen to grow an AlN single crystal. It has been further found that this is not limited to gallium and may also be applied to indium (In), lithium (Li), zinc (Zn), bismuth (Bi) or the like, for example.

An AlN single crystal substrate and an AlN template having an underlying substrate and a thin film of an AlN single crystal formed thereon are preferred as a seed crystal. As the underlying substrate, various substrates, such as a sapphire substrate, GaAs substrate, GaAlAs substrate, GaP substrate, InP substrate, silicon substrate, SiC substrate or the like, may be used. The thickness of the AlN thin film is not particularly limited. A thin film, however, takes a role of selectively generating nuclei for growing the bulk crystal, so that the thickness should be as thin as possible as far as the thin film can take the above role.

The AlN thin film may be formed or deposited by means of a gaseous phase process, such as MOCVD, HVPE, laser CVD, laser ablation, reactive ion sputtering, reactive ion plating, cluster ion film-formation or the like, or by another process.

The raw material for the nitrogen may be nitrogen gas or ammonia, as well as compounds containing sodium and nitrogen such as Na azide, Na azine, Na hydrazide or the like. The material for the aluminum is preferably aluminum metal, and aluminum nitride powder can be used. The material for the gallium is preferably gallium metal, and gallium nitride powder can be used.

According to a preferred embodiment, an AlN single crystal is grown under a nitrogen partial pressure of 50 atms or lower. The inventors have found that an AlN single crystal only can be precipitated, and that the precipitation of a nitride of an element other than aluminum, such as GaN, is suppressed at such a low pressure region. From this viewpoint, the nitrogen partial pressure of the nitrogen is preferably 40 atms or lower, and more preferably 30 atms or lower. Further, the nitrogen partial pressure is preferably 1 atms or higher for facilitating the dissolution of nitrogen into raw materials.

The atmosphere comprising nitrogen may consist only of nitrogen or may contain a gas other than nitrogen. The gas other than nitrogen includes argon. In the case that the nitrogen-containing atmosphere contains a gas other than nitrogen, the total pressure of the atmosphere is preferably 50 atms or higher, and more preferably 100 atms or higher, from the viewpoint of suppressing the evaporation of the flux. Further, when the total pressure of atmosphere exceeds 2000 atms, the densities of the high pressure gas and the growing solution approach each other so that it becomes difficult to hold the growing solution in a crucible. The total pressure of the atmosphere is thus preferably 2000 atms or lower.

Further, although the growth temperature may be appropriately selected, AlN tends to be selectively precipitated at a relatively high growth temperature of, for example, preferably 850° C. or higher, and more preferably, 900° C. or higher. Although the upper limit of the growth temperature is not particularly limited, the temperature is preferably 1200° C. or lower, and more preferably 1100° C. or lower, for avoiding an increase in the vapor pressure of Na.

Among the materials forming the flux, the molar ratios of Ga, Al and Na are not particularly limited, as long as phase separation is avoided. However, the ratio of Al is preferably 100 to 10 mol, and the ratio of Na is preferably 10 to 300 mol, with respect to 100 mol of Ga. Further, in the case that indium (In), lithium (Li), zinc (Zn), bismuth (Bi) or the like, is added, the ratio of gallium may be decreased by the ratio of the added element (addition by replacement) or the element may be added to the whole composition (external addition). Further, two or more of the elements may be added at the same time.

EXAMPLES

Example 1

Ga (purity of 99.999 percent), Al (purity of 99.999 percent) and Na (purity of 99.95 percent) were weighed in a glove box so that Ga:Al:Na are 1:1:2 in the molar ratios. The weighed raw materials were filled in an alumina crucible. Further, an AlN template (produced by forming an aluminum nitride thin film of a thickness of 1 μm on a sapphire single crystal wafer by epitaxial growth) was used as a seed crystal. The alumina crucible and AlN template were contained in a pressure container of stainless steel. Mixed gases of nitrogen-argon (10 percent of nitrogen gas) was used as the atmosphere and the temperature and pressure were elevated to 1200° C. and 500 atms, respectively (nitrogen partial pressure of 50 atms). It was then held at 1200° C. and 500 atms for 100 hours. As a result, it was confirmed that an aluminum nitride single crystal having a thickness of about 1 mm was grown on the AlN template. Further, gallium nitride was not precipitated.

The presence or absence of gallium nitride was confirmed as described below. After the experiment, solid components remaining in the crucible were removed, granulated and subjected to powdery X-ray diffraction analysis to prove that characteristic diffraction peaks corresponding to GaN were not present.

Example 2

The experiment was carried out according to the same procedure as Example 1, except that nitrogen gas was used as the atmospheric gas and the pressure and temperature during the growth were 10 atms and 850° C., respectively. As a result, it was confirmed that an aluminum nitride single crystal having a thickness of about 200 μm was grown on the AlN template. Gallium nitride was not precipitated.

Example 3

The experiment was carried out according to the same procedure as Example 1, except that 50 percent of gallium was replaced with indium having a purity of 99.999 percent (addition by replacement) and the temperature was 1000° C.

As a result, it was confirmed that an aluminum nitride single crystal having a thickness of about 0.5 mm was grown on the AlN template. Further, gallium nitride and indium nitride were not precipitated.

The presence or absence of gallium nitride and indium nitride was confirmed as described below. After the experiment, solid components remaining in the crucible were removed, granulated and subjected to powdery X-ray diffraction analysis to prove that characteristic diffraction peaks corresponding to GaN and InN were not present.

Example 4

The experiment was carried out according to the same procedure as Example 1, except that 10 percent of lithium having a purity of 99.999 percent was added to the whole composition (external addition) and the temperature was 1000° C.

As a result, it was confirmed that an aluminum nitride single crystal having a thickness of about 0.5 mm was grown on the AlN template. Further, gallium nitride and lithium nitride were not precipitated.

The presence or absence of gallium nitride and lithium nitride was confirmed as described below. After the experiment, solid components remaining in the crucible were removed, granulated and subjected to powdery X-ray diffraction analysis to prove that characteristic diffraction peaks corresponding to GaN and $Li_3N$ were not present.

Comparative Example 1

The experiment was carried out according to the same procedure as Example 2, except that the pressure during the growth was 100 atms. However, an AlGaN crystal containing a small amount of Al was grown on the AlN template, and an AlN single crystal was not obtained.

The invention claimed is:

1. A method of producing an AlN single crystal, the method comprising the step of:
   pressurizing a melt comprising at least gallium, aluminum and sodium in an atmosphere comprising nitrogen to grow an AlN single crystal.

2. The method of claim 1, wherein said AlN single crystal is grown at a nitrogen partial pressure at which a GaN single crystal is not precipitated.

3. The method of claim 1, wherein said melt comprises one or more element(s) selected from the group consisting of indium, lithium, zinc and bismuth.

4. The method of claim 1, wherein said AlN single crystal is grown at a temperature of 850° C. or higher and 1200° C. or lower.

5. The method of claim 1, wherein said atmosphere during the growth has a nitrogen partial pressure of 1 atm or higher and 50 atms or lower.

* * * * *